US012072385B2

(12) United States Patent
Tomizawa et al.

(10) Patent No.: US 12,072,385 B2
(45) Date of Patent: Aug. 27, 2024

(54) CHARGE AND DISCHARGE TESTING DEVICE

(71) Applicant: Toyo System Co., Ltd., Fukushima (JP)

(72) Inventors: Yutaka Tomizawa, Fukushima (JP); Hideki Shoji, Fukushima (JP)

(73) Assignee: TOYO SYSTEM CO., LTD., Fukushima (JP)

( * ) Notice: Subject to any disclaimer, the term of this patent is extended or adjusted under 35 U.S.C. 154(b) by 0 days.

(21) Appl. No.: 17/778,070

(22) PCT Filed: Oct. 1, 2021

(86) PCT No.: PCT/JP2021/036463
§ 371 (c)(1),
(2) Date: Oct. 21, 2022

(87) PCT Pub. No.: WO2022/130735
PCT Pub. Date: Jun. 23, 2022

(65) Prior Publication Data
US 2024/0219469 A1    Jul. 4, 2024

(30) Foreign Application Priority Data

Dec. 16, 2020 (JP) ................ 2020-208863

(51) Int. Cl.
*G01R 31/378* (2019.01)
*G01R 1/20* (2006.01)
*H02J 7/00* (2006.01)

(52) U.S. Cl.
CPC ........... *G01R 31/378* (2019.01); *G01R 1/203* (2013.01); *G01R 1/206* (2013.01); *H02J 7/0069* (2020.01)

(58) Field of Classification Search
None
See application file for complete search history.

(56) References Cited

U.S. PATENT DOCUMENTS 7,498,769 B1    3/2009 Potanin et al.
9,312,770 B2    4/2016 Tomizawa et al.
(Continued)

FOREIGN PATENT DOCUMENTS

JP    H06141475 A    5/1994
JP    7123597 A    5/1995
(Continued)

OTHER PUBLICATIONS

International Search Report (ISR) (and English translation thereof) dated Apr. 19, 2022, issued in International Application No. PCT/JP2022/007724.
(Continued)

*Primary Examiner* — Jas A Sanghera
(74) *Attorney, Agent, or Firm* — Holtz, Holtz & Volek PC

(57) ABSTRACT

A bridge circuit including first and second switch elements connected in tandem at a first connection point, and third and fourth switch elements connected in tandem at a second connection point, and a control unit which when a mode signal indicates a first mode, controls the first to fourth switch elements so that the first and fourth switch elements and the second and third switch elements are alternately turned on and off, and when the mode signal indicates a second mode, controls the third switch element to be off state and the fourth switch element to be on state, and applies analog output control to vertically change a current made to flow due to an analog voltage in which a voltage greater than or equal to a gate threshold voltage changes up and down, to the first switch element during charge control and the second switch element in charging.

8 Claims, 10 Drawing Sheets

(56) References Cited

U.S. PATENT DOCUMENTS

| | | | |
|---|---|---|---|
| 9,716,403 | B2 | 7/2017 | Ball |
| 2006/0028188 | A1 | 2/2006 | Hartular et al. |
| 2008/0258687 | A1 | 10/2008 | So et al. |
| 2014/0133206 | A1 | 5/2014 | Shoji et al. |
| 2015/0145491 | A1* | 5/2015 | Tomizawa ............ H02M 3/158 323/271 |
| 2015/0168967 | A1 | 6/2015 | Halder et al. |
| 2020/0259338 | A1 | 8/2020 | Taylor et al. |

FOREIGN PATENT DOCUMENTS

| | | | |
|---|---|---|---|
| JP | 2006121873 | A | 5/2006 |
| JP | 200835620 | A | 2/2008 |
| JP | 2008035620 | A | 2/2008 |
| JP | 2011080966 | A | 4/2011 |
| JP | 2013243874 | A | 12/2013 |
| JP | 2014102890 | A | 6/2014 |
| JP | 2014220896 | A | 11/2014 |
| JP | 201545553 | A | 3/2015 |
| JP | 2015116122 | A | 6/2015 |
| JP | 2015122943 | A | 7/2015 |
| JP | 2020184880 | A | 11/2020 |
| JP | 2021027749 | A | 2/2021 |

OTHER PUBLICATIONS

International Search Report (ISR) dated Apr. 19, 2022, issued in International Application No. PCT/JP2022/007741.
Written Opinion dated Apr. 19, 2022, issued in International Application No. PCT/JP2022/007724.
Written Opinion dated Apr. 19, 2022, issued in International Application No. PCT/JP2022/007741.
Related U.S. Appl. No. 18/013,177, filed Dec. 27, 2022.
Related U.S. Appl. No. 18/013,196, filed Dec. 27, 2022.
Extended European Search Report (EESR) dated Nov. 24, 2023 in counterpart European Application No. 21890362.3.
International Search Report re PCT/JP2021/036463 mailed Nov. 30, 2021 (8 pages).
Canadian Office Action dated May 27, 2024, issued in Canadian Application No. 3,182,392, which is a Canadian counterpart of related U.S. Appl. No. 18/013,177.

* cited by examiner

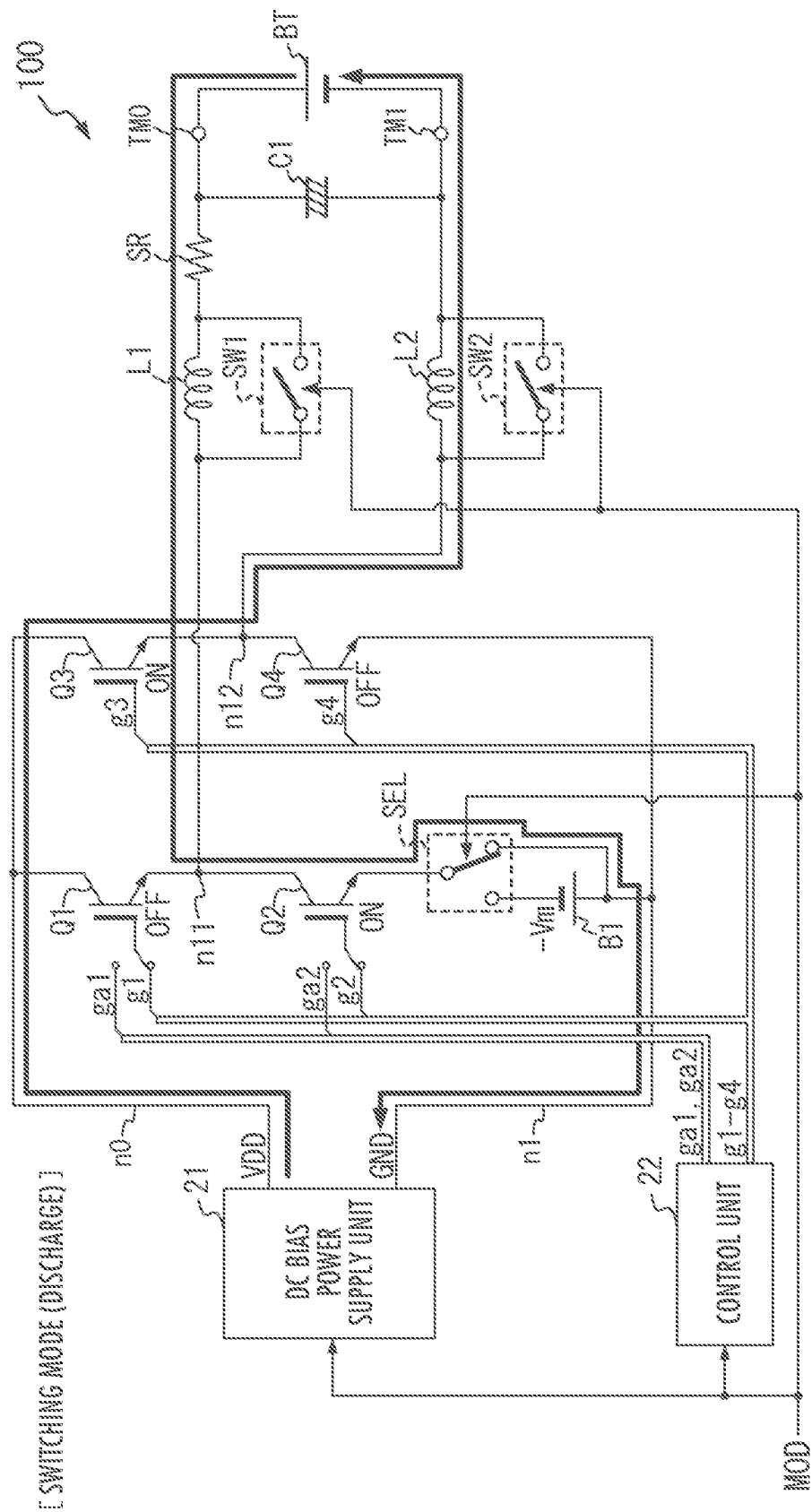

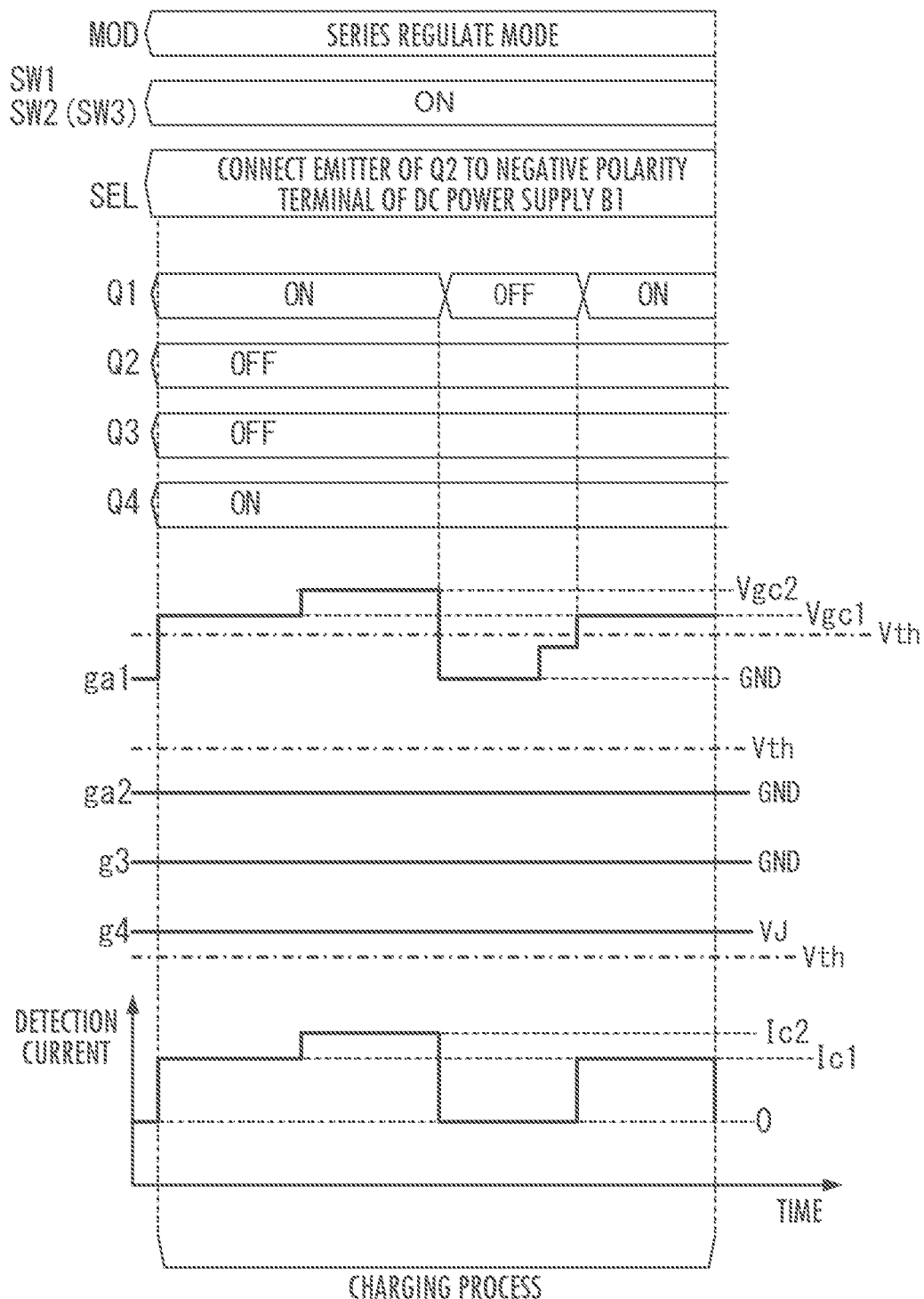

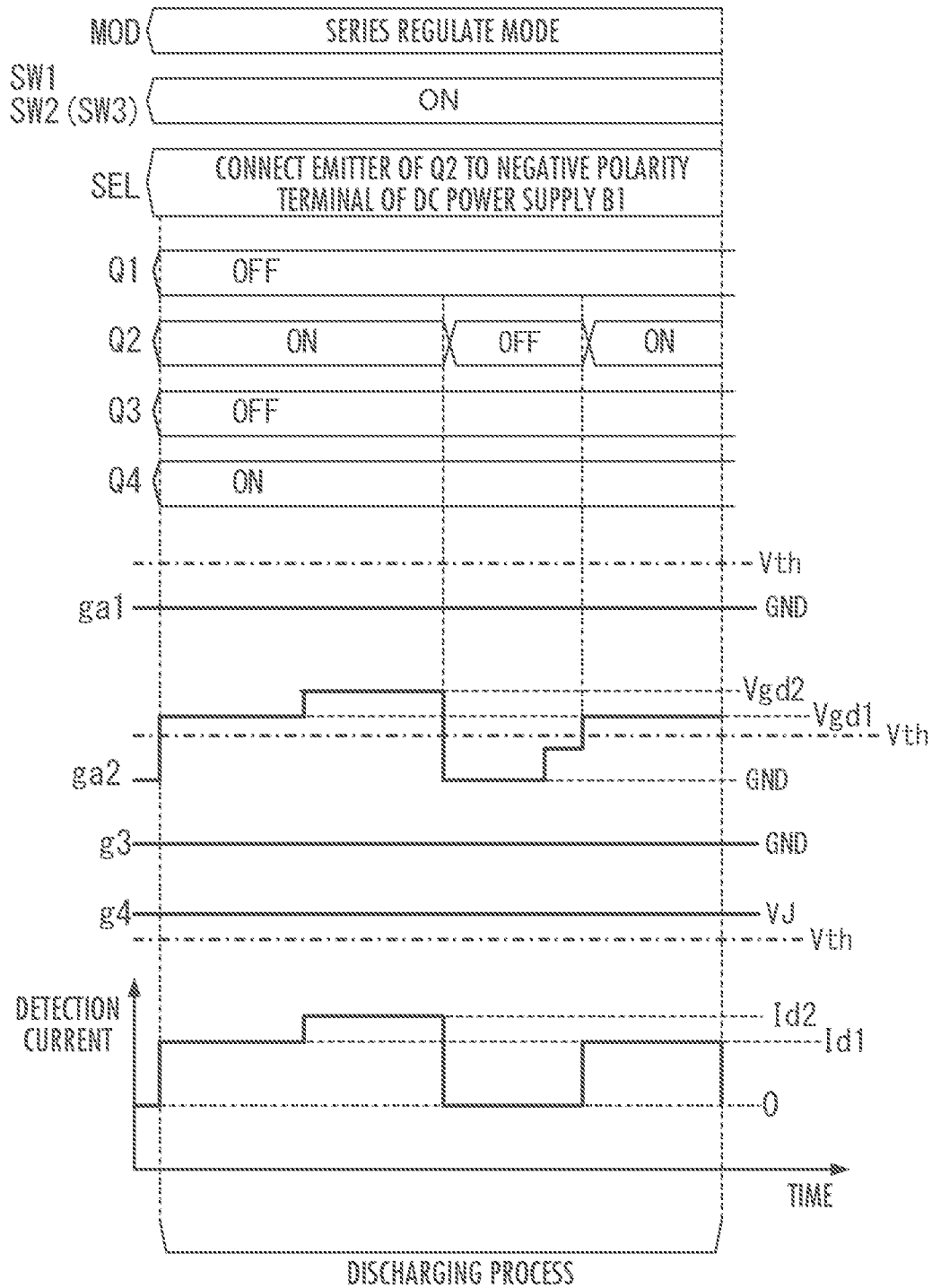

CHARGE AND DISCHARGE TESTING DEVICE

CROSS-REFERENCE TO RELATED APPLICATIONS

This patent application is a U.S. National Stage filing of, and claims priority to and all advantages of, PCT Patent Application Number PCT/JP2021/036463 filed on Oct. 1, 2021, and Japanese Patent Application No. 2020-208863 filed on Dec. 16, 2020, the contents of both of which are incorporated herein by reference in their entireties.

TECHNICAL FIELD

The present invention relates to a charge and discharge testing device which charges and discharges a secondary battery for testing.

BACKGROUND ART

There has been proposed a technique of measuring charge and discharge characteristics of a secondary battery by using a power converter including a bridge circuit comprised of four switch elements (refer to, for example, Patent Literature 1).

The power converter includes a bridge circuit in which first and second switch elements connected to each other in tandem, and third and fourth switch elements connected to each other in tandem are connected in parallel between a high potential line and a ground line, an inductor, and a smoothing capacitor. The inductor has one end connected to a connection point between the first and second switch elements, and the other end connected to a first output point. A second output point is connected to a connection point between the third and fourth switch elements. The smoothing capacitor is connected between the first and second output points. Incidentally, in addition to the inductor, a second inductor may be provided in which one end thereof is connected to the connection point between the third and fourth switch elements, and the other end thereof is connected to the second output point.

Here, in a state in which the positive polarity of a secondary battery whose charge and discharge characteristics are to be measured is connected to the first output point, and the negative polarity thereof is connected to the second output point, first, the first and fourth switch elements are set to an on state, and the second and third switch elements are set to an off state. Thus, the secondary battery is supplied with a charging current through a current path consisting of the first switch element, the inductor, and the fourth switch element, so that the secondary battery is in a charged state. Then, when the first and fourth switch elements are switched to an off state, and the second and third switch elements are switched to an on state, the secondary battery is discharged and thereby a discharging current flows through a current path consisting of the third switch element, the inductor, and the second switch element.

That is, when testing the charge and discharge characteristics of the secondary battery by using the power converter, the on/off states of the first to fourth switch elements are switched alternately as described above (this is referred to a switching system) to thereby repeatedly charge and discharge the secondary battery to be tested.

CITATION LIST

Patent Literature

Patent Literature 1: Japanese Patent Application Laid-Open No. 2013-243874

SUMMARY OF INVENTION

Technical Problem

In the charge and discharge characteristic test of the secondary battery adopting the switching system by the above-described power converter, the charging current or the discharging current is detected, and the charge and discharge characteristics of the secondary battery to be tested are evaluated based on the detected charging current or discharging current.

By the way, when the secondary battery is charge and discharged by the switching system, ripples or noise caused by switching operation is superposed on the charging current and the discharging current.

At this time, for example, when a high output type secondary battery such as a battery for an electric vehicle is targeted for testing, the ratio of ripples or noise to the magnitude of the charging current or the discharging current becomes very small. Therefore, it is possible to perform adequate evaluation on the basis of the detected charging current or discharging current.

However, for example, when a low output type secondary battery for a portable information device is targeted for testing, the ratio of ripples or noise to the magnitude of the charging current or the discharging current increases as compared with the case where the high output type secondary battery is targeted for testing.

Therefore, a problem arises in that when the low output type secondary battery is targeted for testing, the reliability of the results of evaluation of charge and discharge characteristics becomes low due to the ripples or noise accompanying the switching operation.

The present invention has been made in view of the above points, and an object thereof is to provide a charge and discharge testing device capable of evaluating highly reliable charge and discharge characteristics even for both high output type and low output type secondary batteries.

Solution to Problem

There is provided a charge and discharge testing device according to the present invention, which performs a charge and discharge test on a secondary battery. The charge and discharge testing device includes first and second output terminals which connect both ends of the secondary battery, a bridge circuit in which first and second switch elements connected to each other in tandem through a first connection point, and third and fourth switch elements connected to each other in tandem through a second connection point are connected in parallel between a power supply line and a ground line, a charge and discharge current path including a shunt resistor and a first inductor and reaching from the first connection point to the second connection point via the first output terminal and the second output terminal, a capacitor connected between the first and second output terminals, and a control unit which in response to a mode signal to designate a first or second mode, controls the first to fourth switch elements on the basis of the mode signal. When the mode signal indicates the first mode, the control unit controls the first to fourth switch elements so that the first and fourth switch elements and the second and third switch elements are alternately turned on and off, and performs charge control or discharge control by a time ratio between an on time of the first and fourth switch elements and an on time of the second and third switch elements. When the mode signal indicates the second mode, the control unit controls the third switch element to be an off state and the fourth switch element to be an on state, and applies control to change an analog voltage greater than or equal to a gate threshold voltage continuously and up and down to the first switch element at the time of the charge control and the second switch element at the time of the discharge control. Incidentally, a short-circuit switch is provided in parallel with the fourth switch element. When the mode signal indicates the second mode, the short-circuit switch may be set to an on state.

With such a configuration, when the secondary battery to be tested is a high output type, the bridge circuit comprised of the first to fourth switch elements is switching-controlled to charge and discharge the secondary battery. At this time, the ripples or noise accompanying the switching control is superposed on a charging current or a discharging current. However, since the charging current or the discharging current itself is large when the high output type secondary battery is targeted for testing, the ratio of the ripples or noise to the magnitude of the current becomes very small. Therefore, it is possible to perform highly reliable evaluation on the basis of the detected charging current or discharging current.

On the other hand, when the secondary battery to be tested is a low output type, the third switch element is set to the off state, and the fourth switch element is set to the on state. Further, the bridge circuit is controlled so as to change the analog voltage greater than or equal to the gate threshold voltage up and down instead of switching control to turn on or off a current made to flow through the first switch element during charge control and flow through the second switch element during discharge control, to thereby charge and discharge the secondary battery. Thus, since the secondary battery to be tested operates in a series regulated system instead of switching operation when it is the low output type, the generated ripples or noise becomes virtually zero.

Thus, according to the charge and discharge testing device according to the present invention, it is possible to evaluate highly reliable charge and discharge characteristics even for both high output type and low output type secondary batteries.

BRIEF DESCRIPTION OF DRAWINGS

FIG. 4 is a diagram showing a path of a discharging current which flows into the charge and discharge testing device 100 in a switching mode (discharging process);

FIG. 5A is a time chart showing internal operations of the charge and discharge testing device 100 in a series regulate mode (charging process);

FIG. 5B is a time chart showing internal operations of the charge and discharge testing device 100 in a series regulate mode (discharging process);

DESCRIPTION OF EMBODIMENTS

Hereinafter, a charge and discharge testing device according to the present invention will be described with reference to the drawings.

Figure 1:
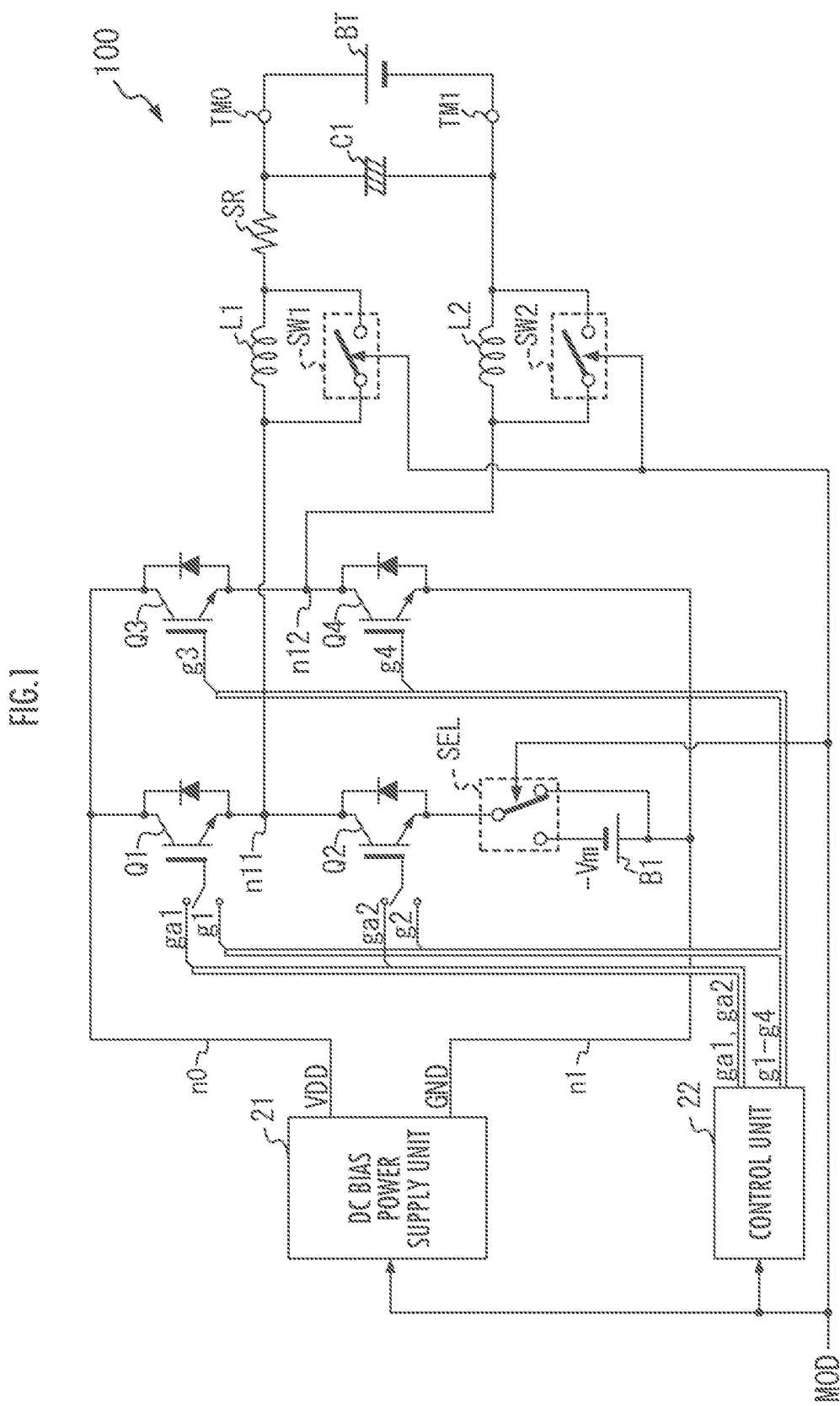
FIG. 1 is a block diagram showing an example of a configuration of a charge and discharge testing device 100 according to the present invention.

FIG. 1 is a block diagram showing a configuration of a charge and discharge testing device 100. Note that in FIG. 1, there is shown a state in which a secondary battery BT to be tested is connected to the charge and discharge testing device 100.

The charge and discharge testing device 100 includes a DC bias power supply unit 21, a control unit 22, a bridge circuit comprised of transistors Q1 to Q4, a selector SEL, a DC power supply B1, inductors L1 and L2 (also including the case of L1 only), short-circuit switches SW1 and SW2 (unnecessary where there is no L2), a shunt resistor SR, and a smoothing capacitor C1.

The DC bias power supply unit 21 receives a mode signal MOD which designates one of a switching mode and a series regulate mode. When the mode signal MOD indicates the switching mode, the DC bias power supply unit 21 applies a power supply potential VDD having a DC potential V1 (for example, a few hundreds of volts) to a power supply line n0 and applies a ground potential GND to a ground line n1. On the other hand, when the mode signal MOD indicates the series regulate mode, the DC bias power supply unit 21 applies a power supply potential VDD having a DC potential V2 (for example, a few tens of volts) lower than the potential V1 to the power supply line n0 and applies the ground potential GND to the ground line n1.

The control unit 22 generates control signals g1 to g4 or analog output control signals ga1 and ga2 which cause the secondary battery BT to be tested to alternate between charging and discharging. Incidentally, the control unit 22 changes in response to the above-described mode signal MOD, the signal form of the switch output control signals g1 to g4 or the analog output control signals g1 and g2 depending on whether the mode signal MOD indicates either of the switching mode and the series regulate mode.

When the mode signal MOD indicates the switching mode, the control unit 22 generates a binary signal in which a first potential higher than a threshold voltage of each of the transistors (Q1 to Q4) and a second potential lower than the threshold voltage appear alternately, as the switch output control signals g1 and g4, and generates a signal in which the phase of the binary signal is inverted, as the switch output control signals g2 and g3.

On the other hand, when the mode signal MOD indicates the series regulate mode, the control unit 22 generates analog output control signals ga1 and ga2 in which an analog voltage greater than or equal to a gate threshold voltage changes up and down. Further, the control unit 22 generates a switch output control signal g3 to maintain a state of a predetermined low potential lower than the threshold voltage of the transistor Q3, and a switch output control signal g4 to maintain a state of a predetermined high potential higher than the threshold voltage of the transistor Q4.

The control unit 22 supplies the switch output control signal g1 or analog output control signal ga1 generated as described above to a gate (control terminal) of the transistor Q1, supplies the switch output control signal g2 or the analog output control signal ga2 to a gate (control terminal) of the transistor Q2, supplies the switch output control signal g3 to a gate (control terminal) of the transistor Q3, and supplies the switch output control signal g4 to a gate (control terminal) of the transistor Q4.

Each of the transistors Q1 to Q4 is comprised of, for example, an insulated gate bipolar transistor (IGBT) as a switch element. Incidentally, as each of the transistors Q1 to Q4, a switch element such as a bipolar transistor or an FET (Field Effect Transistor) may be used.

A collector of the transistor Q1 is connected to the power supply line n0 and receives the power supply potential VDD through the power supply line n0. An emitter of the transistor Q1 is connected to a collector of the transistor Q2 through a node n11. The transistor Q1 is set to an on state or an off state according to the switch output control signal g1 or the analog output control signal ga1 supplied to its own gate. When the transistor Q1 is set to the on state (when the transistor Q4 is on), the transistor Q1 sends a current based on the power supply potential VDD from its own emitter to the node n11 as a charging current.

An emitter of the transistor Q2 is connected to the selector SEL. The transistor Q2 is set to an on state or an off state according to the switch output control signal g2 or the analog output control signal ga2 supplied to its own gate. When the transistor Q2 is set to the on state (when the transistor Q3 is on), the transistor Q2 sends the current supplied via the node n11 from its own emitter to the selector SEL.

The selector SEL is comprised of, for example, a transfer contact type relay or the like. When the mode signal MOD indicates the switching mode, the selector SEL connects the emitter of the transistor Q2 to the ground line n1. That is, at this time, the ground potential GND is applied to the emitter of the transistor Q2 via the ground line n1. On the other hand, when the mode signal MOD indicates the series regulate mode, the selector SEL connects the emitter of die transistor Q2 to a negative polarity terminal of the DC power supply B1.

The DC power supply B1 generates a DC voltage Vm obtained by adding a predetermined margin voltage to a voltage drop portion associated with the on resistance value of the transistor Q2, the resistance value of the shunt resistor SR, and the resistance value of a wiring resistance connecting the DC power supply B1. Here, as shown in FIG. 1, a positive polarity terminal of the DC power supply B1 is connected to the ground line n1. Thus, when the emitter of the transistor Q2 is connected to the negative polarity terminal of the DC power supply B1 through the selector SEL, a negative polarity bias potential (−Vm) having a potential of negative polarity to the ground potential is applied to the emitter of the transistor Q2.

A collector of the transistor Q3 is connected to the power supply line n0 and receives the power supply potential VDD through the power supply line n0. An emitter of the transistor Q3 is connected to a collector of the transistor Q4 through a node n12. The transistor Q3 is set to an on state or an off state according to the switch output control signal g3 supplied to its own gate. When the transistor Q3 is set to the on state (when the transistor Q2 is on), the transistor Q3 sends a discharging current flowing with the discharge of the secondary battery BT to be tested from its own emitter to the node n12.

An emitter of the transistor Q4 is connected to the ground line n1. The transistor Q4 is sent to an on state or an off state according to the switch output control signal g4 supplied to its own gate. When the transistor Q4 is set to the on state (when the transistor Q1 is on), the transistor Q4 sends the charging current supplied via the node n12 from its own emitter to the ground line n1.

One end of the inductor L1 is connected to the node n11, and the other end thereof is connected to one end of the shunt resistor SR.

The short-circuit switch SW1 is comprised of, for example, a semiconductor relay, a mechanical relay, or a contactless relay such as a photocoupler, or the like, and is connected to both ends of the inductor L1. In response to the above-described mode signal MOD, when the mode signal MOD indicates the series regulate mode, the short-circuit switch SW1 is brought into an on state to short-circuit both ends of the inductor L1. On the other hand, when the mode signal MOD indicates the switching mode, the short-circuit switch SW1 is brought into an off state to release the short-circuited state at both ends of the inductor L1.

A positive side output terminal TM0 is connected to the other end of the shunt resistor SR. The shunt resistor SR (or may be a current sensor for detecting the current) is provided to detect the current amounts of the charging current supplied to the secondary battery BT and the discharging current sent out from the secondary battery BT in a charge and discharge test. An ammeter (not shown) which detects the discharging current and the charging current is connected to the shunt resistor SR.

The smoothing capacitor C1 has one end connected to the positive side output terminal TM0 and the other end connected to a negative side output terminal TM1.

Incidentally, during the charge and discharge test, as shown in FIG. 1, the positive polarity terminal of the battery BT to be tested is connected to the positive side output terminal TM0, and the negative polarity terminal of the battery BT is connected to the negative side output terminal TM1.

One end of the inductor L2 is connected to the node n12, and the other end thereof is connected to the negative side output terminal TM1.

The short-circuit switch SW2 is comprised of, for example, a semiconductor relay, a mechanical relay, or a contactless relay such as a photocoupler, or the like, and is connected to both ends of the inductor L2. In response to the above-described mode signal MOD, when the mode signal MOD indicates the series regulate mode, the short-circuit switch SW2 is brought into an on state to short-circuit both ends of the inductor L2. On the other hand, when the mode signal MOD indicates the switching mode, the short-circuit switch SW2 is brought into an off state to release the short-circuited state at both ends of the inductor L2.

Hereinafter, the operation of the charge and discharge test by the charge and discharge testing device 100 will be described in detail separately for the case where the battery BT to be tested is a battery of high output type (a few hundreds of volts), and the case where the battery BT is a battery of low output type (a few volts to dozen of volts). Incidentally, in the charge and discharge test, while alternately executing a charging process to charge the battery BT and a discharging process to discharge the same, the charging current supplied to the battery BT in the charging process and the discharging current sent out from the battery BT in the discharging process are detected.

Figure 2:
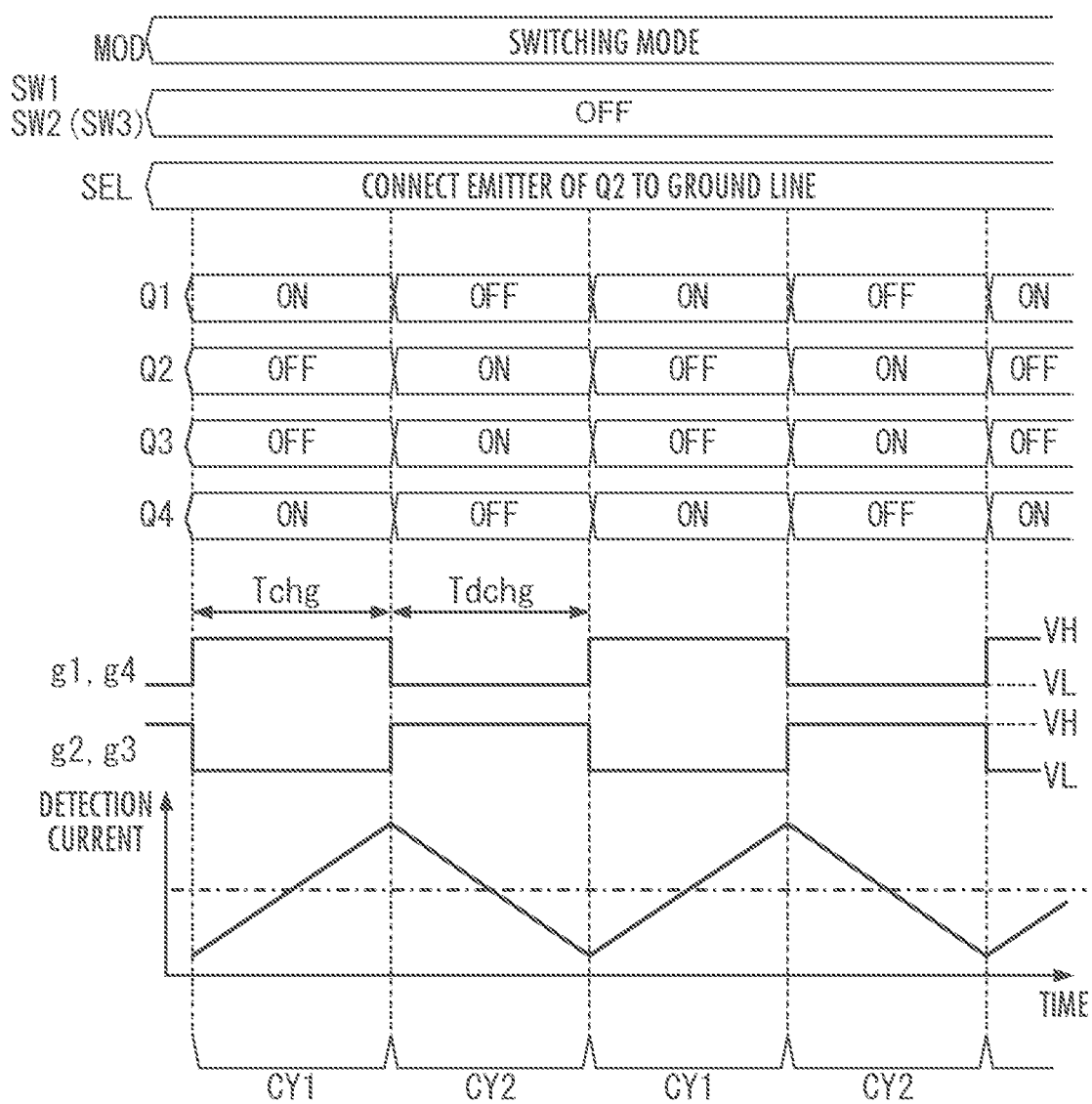
FIG. 2 is a time chart showing internal operations of the charge and discharge testing device 100 in a switching mode.

First, the charge and discharge test in the case where the high output type battery is targeted for testing will be described with reference to the time chart shown in FIG. 2 illustrating the internal operations of the charge and discharge testing device 100.

[Charge and Discharge Test for High Output Type Battery]

When the battery BT to be tested is the high output type, the mode signal MOD indicative of the switching mode is supplied to the charge and discharge testing device 100. Thus, the DC bias power supply unit 21 applies a power supply potential VDD having a potential V1 higher than a voltage generated by the battery BT to the power supply line n0.

Also, depending on the mode signal MOD indicating the switching mode, the short-circuit switches SW1 and SW2 are both brought into an off state as shown in FIG. 2, and the selector SEL is brought into a state of connecting the emitter of the transistor Q2 to the ground line n1.

In addition, when the mode signal MOD indicates the switching mode, as shown in FIG. 2, the control unit 22 generates as the switch output control signals g1 and g4, a binary PWM signal in which a state to maintain a high potential VH and a state to maintain a low potential VL appear alternately and repeatedly. Further, as shown in FIG. 2, the control unit 22 generates a signal in which the phase of the PWM signal is inverted, as the switch output control signals g2 and g3.

At this time, as shown in FIG. 2, the transistor Q1 becomes an on state while the switch output control signal g1 maintains the high potential VH and becomes an off state while the switch output control signal g1 maintains the low potential VL. The transistor Q2 becomes an on state while the switch output control signal g2 maintains the high potential VH and becomes an off state while the switch output control signal g2 maintains the low potential VL. The transistor Q3 becomes an on state while the switch output control signal g3 maintains the high potential VH and becomes an off state while the switch output control signal g3 maintains the low potential VL. The transistor Q4 becomes an on state while the switch output control signal g4 maintains the high potential VH and becomes an off state while the switch output control signal g4 maintains the low potential VL.

Thus, in the switching mode, as shown in FIG. 2, a charging process CY1 during which the transistors Q1 and Q4 are brought into an on state, and the transistors Q2 and Q3 are brought into an off state, and a discharging process CY2 during which the transistors Q2 and Q3 are brought into an on state, and the transistors Q1 and Q4 are brought into an off state are performed alternately and repeatedly.

Figure 3:
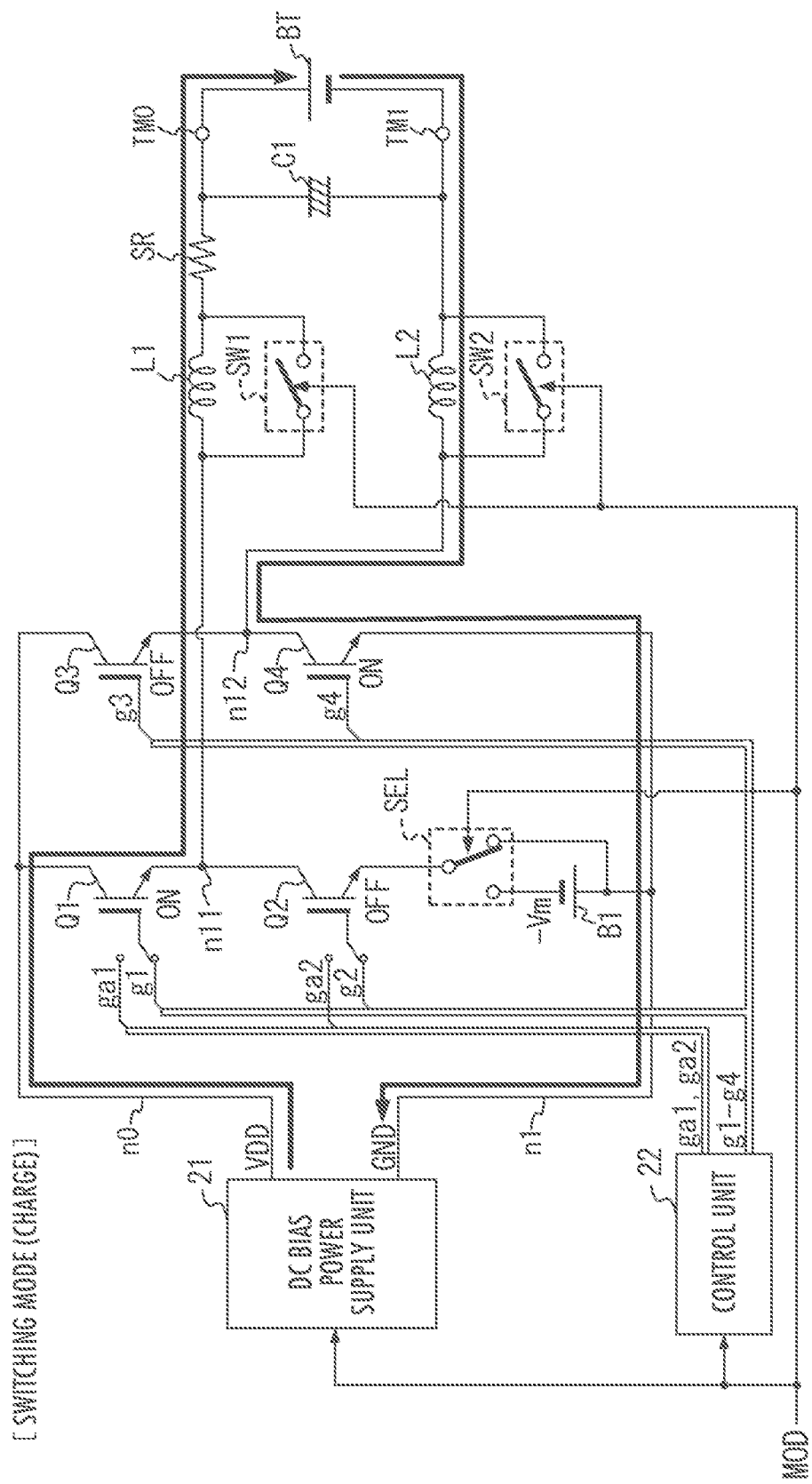
FIG. 3 is a diagram showing a path of a charging current which flows into the charge and discharge testing device 100 in a switching mode (charging process)

In the charging process CY1, as shown by a thick arrow in FIG. 3, the battery BT is supplied with a charging current through a current path made up of the power supply line n0, the transistor Q1, the inductor L1, the shunt resistor SR, the positive side output terminal TM0, the negative side output terminal TM1, the inductor L2, the transistor Q4, and the ground line n1. Thus, the battery BT is charged by the charging current over the period of the charging process CY1. At this time, the charging current detected by the shunt resistor SR gradually increases over the period from the start time of the charging process CY1 to the end time thereof by an LC circuit comprised of the inductors L1 and L2 and the capacitor C1 as shown in FIG. 2.

On the other hand, in the discharging process CY2, as shown by a thick arrow in FIG. 4, there is formed a current path made up of the power supply line n0, the transistor Q3, the inductor L2, the negative side output terminal TM1, the positive side output terminal TM0, the shunt resistor SR, the inductor L1, the transistor Q2, the selector SEL, and the ground line n1. Thus, the battery BT is discharged and thereby a discharging current associated with its discharge is sent out therefrom. At this time, the discharging current which flows through the shunt resistor SR flows in the direction opposite to the above-described charging current. Accordingly, the discharging current detected by the shunt resistor SR is gradually reduced over the period from the start time of the discharging process CY2 to the end time thereof by the LC circuit comprised of the inductors L1 and L2 and the capacitor C1 as shown in FIG. 2.

Thus, in the switching mode, charge control or discharge control is performed based on the time ratio between the on-time of the transistors Q1 and Q4 and the on-time of the transistors Q2 and Q3.

Next, the charge and discharge test in the case where the low output type battery is targeted for testing will be described with reference to the time charts shown in FIGS. 5A and 5B illustrating the internal operations of the charge and discharge testing device 100.

[Charge and Discharge Test for Low Output Type Battery]

When the battery BT to be tested is the low output type, the mode signal MOD indicative of the series regulate mode is supplied to the charge and discharge testing device 100. Thus, the DC bias power supply unit 21 applies a power supply potential VDD having a potential V2 (V2<V1) higher than a voltage generated by the battery BT to the power supply line n0.

Also, depending on the mode signal MOD indicating the series regulate mode, the short-circuit switches SW1 and SW2 are both brought into an on state as shown in FIG. 5A or 5B to short-circuit both ends of the inductor L1 and short-circuit both ends of the inductor L2. Further, the selector SEL is brought into a state of connecting the emitter of the transistor Q2 to the negative polarity terminal of the DC power supply B1. Thus, the emitter of the transistor Q2 is applied with a negative polarity bias potential (−Vm).

In addition, when the mode signal MOD indicates the series regulate mode, the control unit 22 generates an analog output control signal ga1 in which an analog voltage greater than or equal to a gate threshold voltage of the transistor Q1 changes up and down, in the charging process as shown in FIG. 5A.

Incidentally, in the example shown in FIG. 5A, when the signal level of the analog output control signal ga1 rises to a potential Vgc1 higher than the threshold voltage Vth from the state of the ground potential GND in the charging process, the charging current begins to flow. When the signal level continues to rise to a potential Vgc2 higher than the potential Vgc1, it rises to the charging current equivalent to a gate potential. Further, when the gate potential drops to the threshold voltage Vth or less, no charging current flows. At this time, as shown in FIG. 5A, the control unit 22 maintains the signal level of the analog output control signal ga2 at the ground potential GND or a minus bias potential within a range guaranteed by a switching element.

Further, when the mode signal MOD indicates the series regulate mode, the control unit 22 generates an analog output control signal ga2 in which an analog voltage greater than or equal to a gate threshold voltage of the transistor Q2 changes up and down, in the discharging process as shown in FIG. 5B. Incidentally, in the example shown in FIG. 5B, when the signal level of the analog output control signal ga2 rises to a potential Vgd1 higher than the threshold voltage Vth from the state of the ground potential GND in the charging process, the discharging current begins to flow. When the signal level continues to rise to a potential Vgd2 higher than the potential Vgd1, it rises to the discharging current equivalent to a gate potential. Further, when the gate potential drops to the threshold voltage Vth or less, no discharging current flows. At this time, as shown in FIG. 5B, the control unit 22 maintains the signal level of the analog output control signal ga1 at the ground potential GND (or a minus bias potential within a range guaranteed by a switching element).

Incidentally, in the examples shown in FIGS. 5A and 5B, the analog output control signals ga1 and ga2 change up and down stepwise in signal level. However, as the analog output control signals ga1 and ga2, for example, a sinusoidal signal may be adopted in which its signal level changes up and down and gradually with the threshold voltage Vth as the boundary, and is not limited in its waveform itself.

Figure 6:
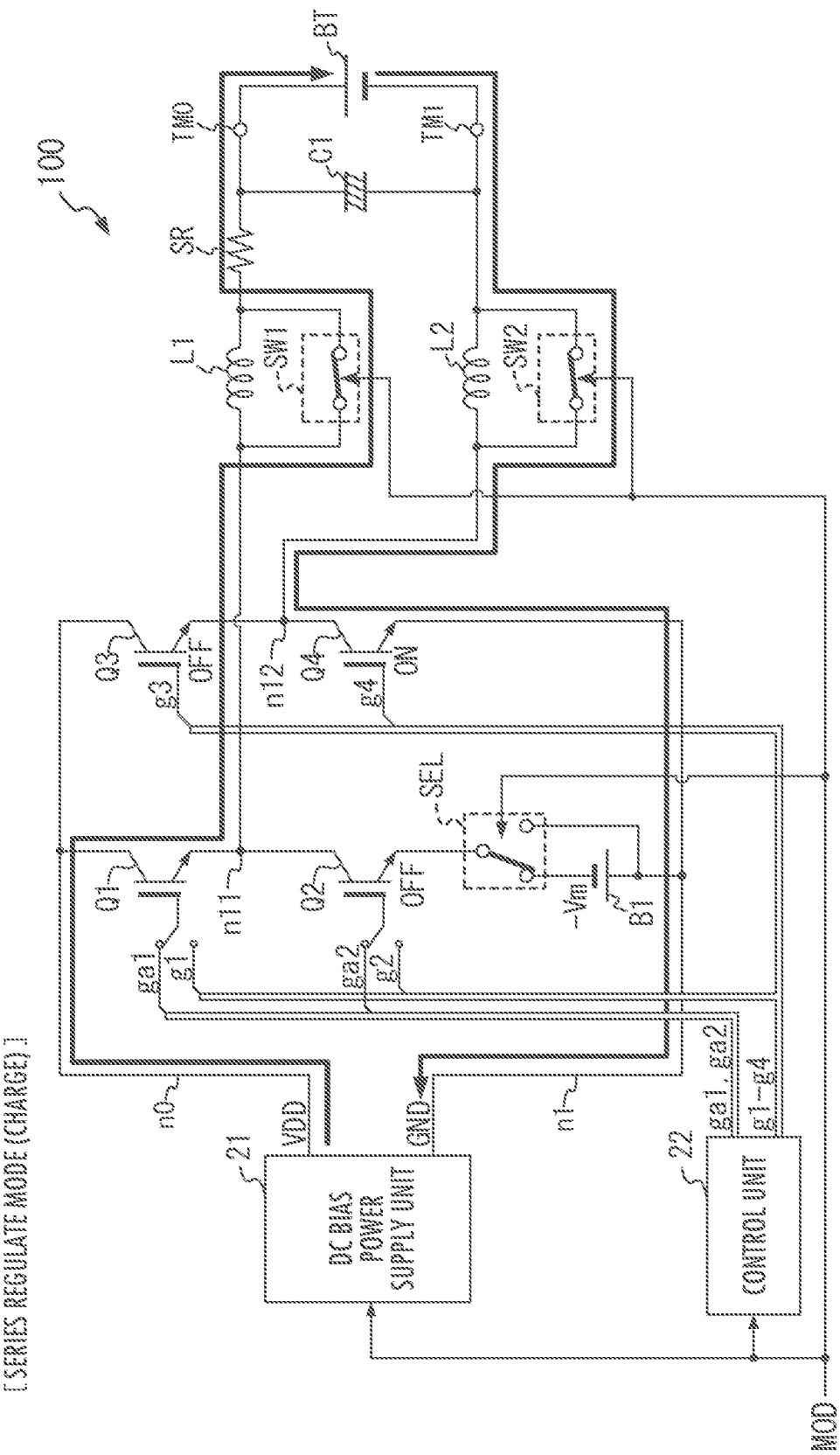
FIG. 6 is a diagram showing a path of a charging current which flows into the charge and discharge testing device 100 in a series regulate mode (charging process)

Thus, in the charging process shown in FIG. 5A, as shown by a thick arrow in FIG. 6, the battery BT is supplied with the charging current through a current path made up of the power supply line n0, the transistor Q1, the short-circuit switch SW1, the shunt resistor SR, the positive side output terminal TM0, the negative side output terminal TM1, the short-circuit switch SW2, the transistor Q4, and the ground line n1. Consequently the battery BT is charged by the charging current. At this time, in the charging process, the charging current detected by the shunt resistor SR follows the signal level of the analog output control signal ga1 supplied to the gate of the transistor Q1 as shown in FIG. 5A. For example, as shown in FIG. 5A, while the analog output control signal ga1 of the potential Vgc1 (Vgc1>Vth) is being fed to the gate of the transistor Q1, the transistor Q1 is brought into an on state to send out a charging current of a current value Ic1 corresponding to the potential Vgc1. Thus, the charging current of the current value Ic1 is detected through the shunt resistor SR. Then, as shown in FIG. 5A, when the signal level of the analog output control signal ga1 rises to the potential Vgc2, the transistor Q1 sends out a charging current of a current value Ic2 corresponding to the potential Vgc2, so that the charging current of the current value Ic2 is detected through the shunt resistor SR. Thereafter, when the signal level of the analog output control signal ga1 drops to the ground potential GND (GND<Vth), as shown in FIG. 5A, the transistor Q1 is brought into an off state so that the current value of the charging current becomes zero, thus resulting in the detection thereof through the shunt resistor SR.

Figure 7:
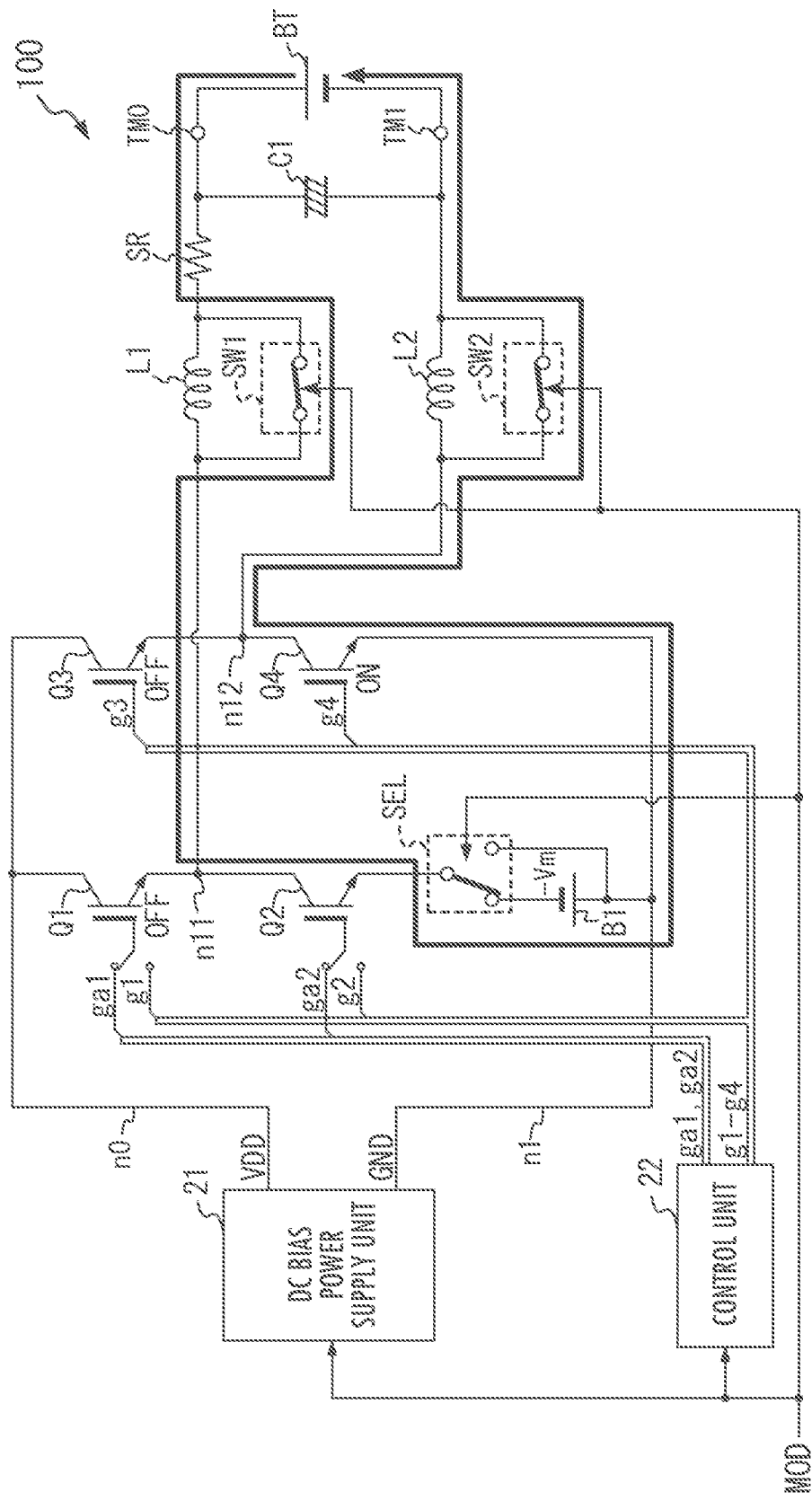
FIG. 7 is a diagram showing a path of a discharging current which flows into the charge and discharge testing device 100 in a series regulate mode (discharging process)

On the other hand, in the discharging process shown in FIG. 5B, as shown by a thick arrow in FIG. 7, there is formed a current path made up of the positive side output terminal TM0, the shunt resistor SR, the short-circuit switch SW1, the transistor Q2, the selector SEL, the DC power supply B1, the transistor Q4, the short-circuit switch SW2, and the negative side output terminal TM1. Thus, the battery BT is discharged and thereby a discharging current associated with its discharge is sent out therefrom. At this time, in the discharging process, the discharging current detected by the shunt resistor SR follows the signal level of the analog output control signal ga2 supplied to the gate of the transistor Q2 as shown in FIG. 5B. Further, in the shunt resistor SR, the discharging current flows in the direction opposite to the above-described charging current. Thus, for example, as shown in FIG. 5B, while the analog output control signal ga2 of the potential Vgd1 (Vgd1>Vth) is being fed to the gate of the transistor Q2, the transistor Q2 is brought into an on state, so that a discharging current of a current value Id1 corresponding to the potential Vgd1 flows in the direction opposite to the above-described charging current. Thus, the discharging current of the current value Id1 of negative polarity is detected through the shunt resistor SR. Then, as shown in FIG. 5B, when the signal level of the analog output control signal ga2 rises to the potential Vgd2, the transistor Q2 sends out a discharging current of a current value Id2 corresponding to the potential Vgd2. Thus, the discharging current of the current value Id2 of negative polarity is detected through the shunt resistor SR. The voltage of the battery BT is gradually reduced with its discharge.

Incidentally, with the provision of the DC power supply B1, the charge and discharge testing device 100 enables a discharge test in which the battery BT is discharged until the voltage value of the battery BT becomes zero in the series regulate mode. If there is no DC power supply B1, the ground potential GND is applied to the emitter of the transistor Q2. At this time, when the voltage value of the battery BT is lowered to a voltage value equivalent to a voltage drop portion associated with the on resistance value of the transistor Q2, the resistance value of the inductor L1, the resistance value of the shunt resistor SR, and the resistance value of a wiring resistance with the discharge of the battery BT, the transistor Q2 is brought into an off state at that time. Thus, the discharge test is ended before the voltage value of the battery BT reaches zero.

Therefore, in the series regulate mode, the charge and discharge testing device 100 allows the discharge to continue until the voltage value of the battery BT becomes zero by applying the negative polarity bias potential (−Vm) generated in the DC power supply B1 instead of the ground potential GND to the emitter of the transistor Q2.

Further, in the above-described embodiment, during the series regulate mode, the transistor Q4 is fixed and set to the on state to thereby form the common current path for the charging current and the discharging current. However, at this time, there is a possibility that when the collector-emitter voltage of the transistor Q4 increases, for example, the power loss of the transistor Q4 becomes large, and the generated heat of the transistor Q4 exceeds a specified temperature. Therefore, in such a case, the current path between the node n12 and the ground line n1 may be formed by connecting a mechanical relay in parallel between the collector and emitter of the transistor Q4, and setting the mechanical relay to the on state.

Figure 8:
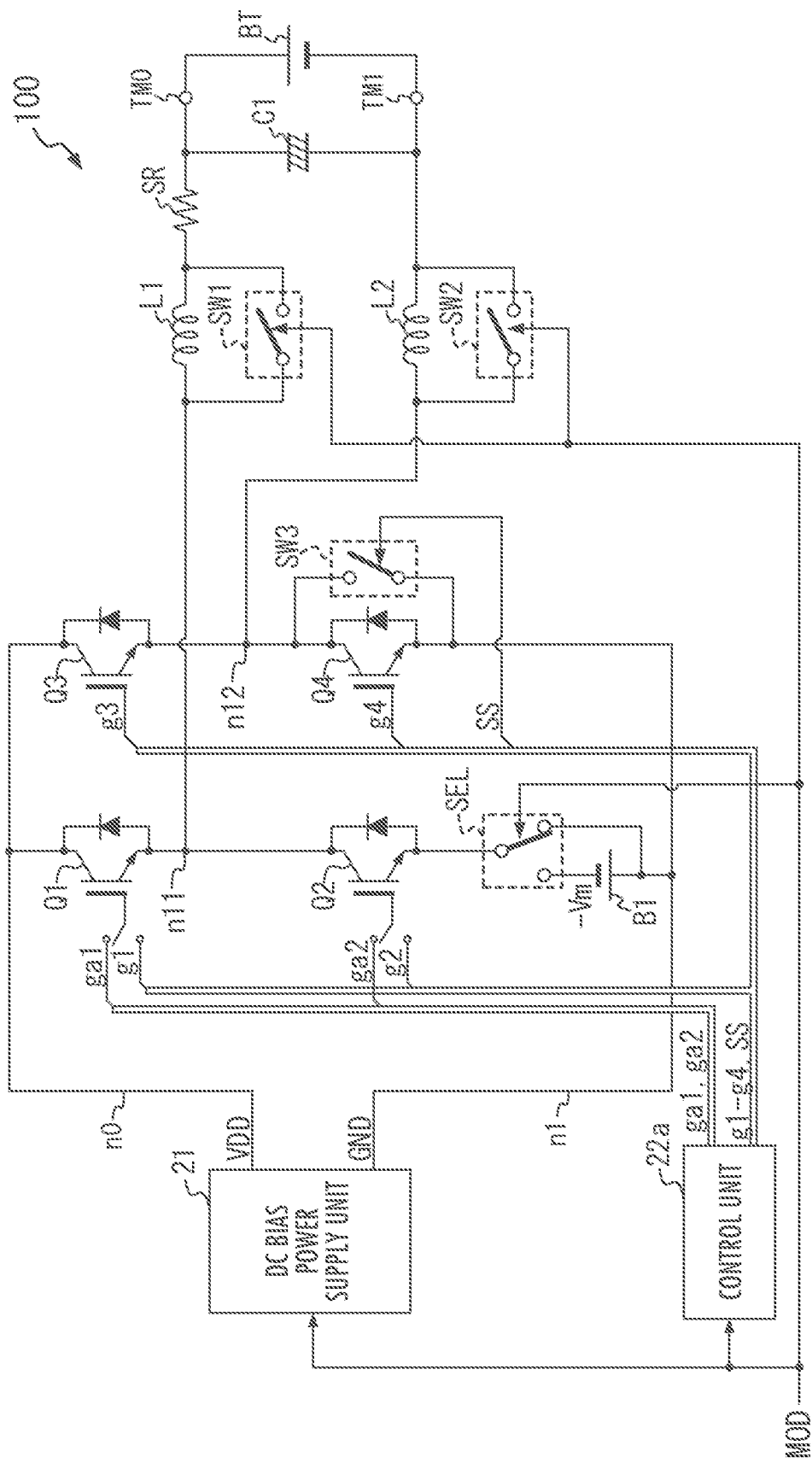
FIG. 8 is a block diagram showing another example of the configuration of the charge and discharge testing device 100.

FIG. 8 is a block diagram showing another example of the charge and discharge testing device 100 made in view of such a point.

Incidentally, in the configuration shown in FIG. 8, other configurations except that a switch element SW3 comprised of, for example, a mechanical relay or the like is newly provided, and a control unit 22a is adopted instead of the control unit 22, are the same as those shown in FIG. 1.

When a mode signal MOD indicates a switching mode, the control unit 22a supplies switch output control signals g1 to g4 similar to those in the control unit 22 to transistors Q1 to Q4 and supplies a control signal SS which sets the switch element SW3 to an off state to the switch element SW3. That is, the switch element SW3 is fixed and set to the off state in the switching mode.

On the other hand, when the mode signal MOD indicates a series regulate mode, the control unit 22a supplies a switch output control signal g3 similar to that in the control unit 22 to the transistor Q3, and supplies analog output control signals ga1 to ga2 to the transistors Q1 and Q2. Further, at this time, the control unit 22a supplies the switch output control signal g4 which sets the transistor Q4 to an off state to the transistor Q4, and supplies the control signal SS which sets the switch element SW3 to an on state to the switch element SW3. Thus, in the series regulate mode, a current path between a node n12 and a ground line n1 is formed by the switch element SW3. A temperature rise in the transistor Q4 in the series regulate mode is avoided.

Incidentally, in the charge and discharge testing device 100 in the above-described embodiment, the positive side output terminal TM0 and the negative side output terminal TM1 for connecting the battery BT to be tested, and the bridge circuit (Q1 to Q4) are connected through the inductors L1 and L2, but either one of the inductors may be omitted.

Figure 9:
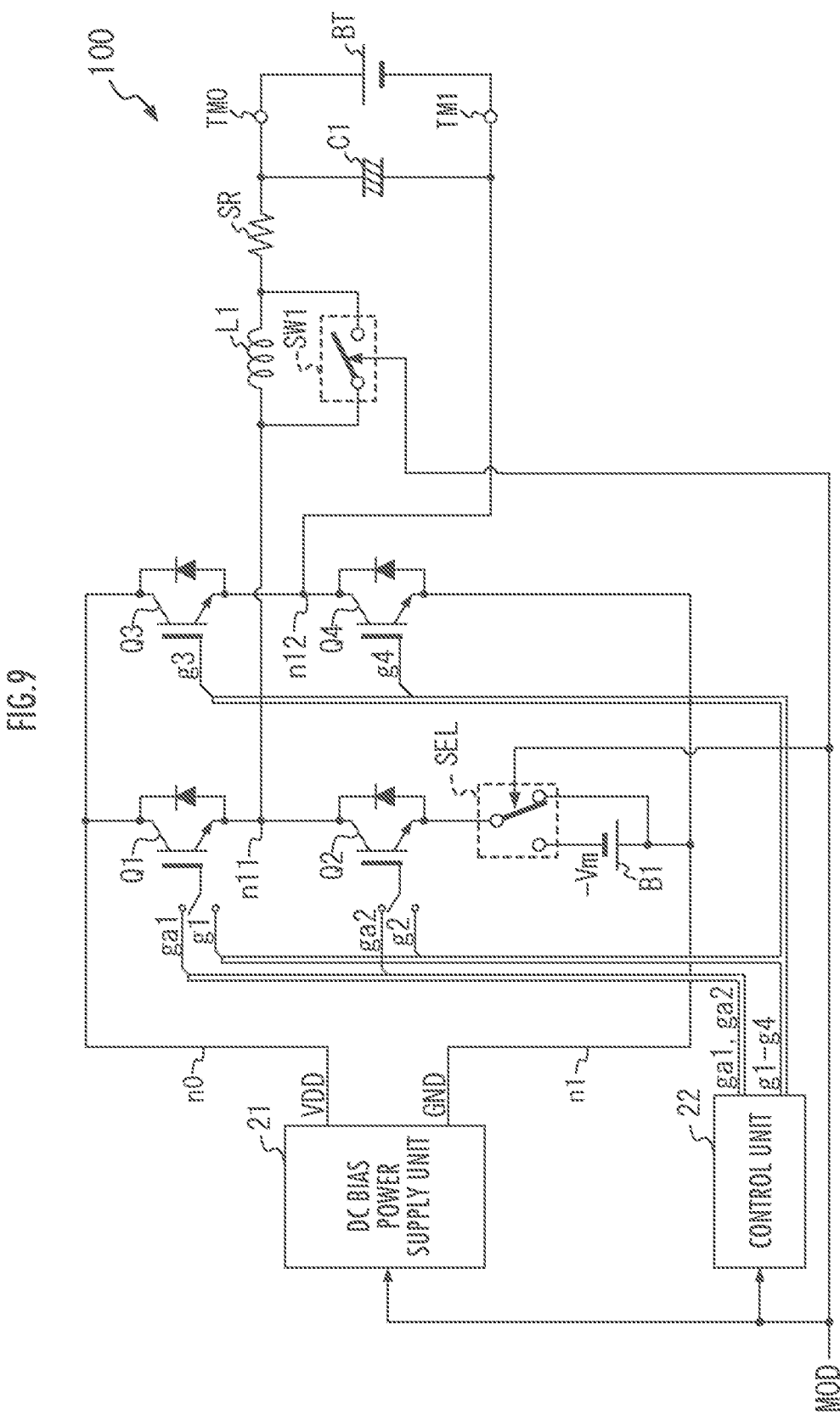
FIG. 9 is a block diagram showing a modification of the configuration of the charge and discharge testing device 100.

FIG. 9 is a circuit diagram showing a modification of the charge and discharge testing device 100 made in view of such a point. Incidentally, in the configuration shown in FIG. 9, other configurations except that the inductor L2 and the short-circuit switch SW2 connected between the node n12 (second connection point of bridge circuit) of the bridge circuit (Q1 to Q4) and the negative side output terminal TM1 are omitted are the same as those shown in FIG. 1.

As described above in detail, the charge and discharge testing device 100 includes first and second output terminals for connecting a secondary battery to be tested, the following bridge circuit, charge and discharge current path and capacitor, and a control unit which controls the bridge circuit.

That is, the bridge circuit includes a first switch element (Q1) and a second switch element (Q2) connected to each other in tandem through a first connection point (n11) and a third switch element (Q3) and a fourth switch element (Q4) connected to each other in tandem through a second connection point (n12), which are connected in parallel between a power supply line (n0) and a ground line (n1). The charge and discharge current path includes a shunt resistor (SR) and a first inductor (L1) and is arranged from the first connection point (n11) to the second connection point (n12) via the first output terminal (TM0) and the second output terminal (TM1). The capacitor (C1) is connected between the first and second output terminals. In response to a mode signal (MOD) to designate a first mode (switching mode) or a second mode (series regulate mode), the control unit (22) controls the first to fourth switch elements on the basis of the mode signal. That is, when the mode signal indicates the first mode, the control unit supplies a binary switch output control signal in which the first and fourth switch elements and the second and third switch elements are alternately turned on and off to a control terminal (gate) of each of the first to fourth switch elements to charge and discharge the secondary battery (BT) to be tested.

On the other hand, when the mode signal indicates the second mode, the control unit sets the third switch element to an off state and the fourth switch element to an on state, and supplies an analog output control signal in which an analog voltage greater than or equal to a gate threshold voltage changes up and down, to the first and second switch elements instead of switching control to turn on or off the first and second switch elements. That is, the control unit applies analog output control to change an analog voltage greater than or equal to a gate threshold voltage continuously and up and down to the first and second switch elements instead of switching control to turn on or off a current made to flow through the first switch element during charge control and flow through the second switch element during discharge control, to thereby charge and discharge the secondary battery to be tested.

With such a configuration, when the secondary battery (BT) to be tested is a high output (hundreds volts) type, each switch element (Q1 to Q4) of the bridge circuit is switching-controlled in the first mode (switching mode). Incidentally, when the bridge circuit is controlled in the first mode, ripples or noise generated with the switching operation is superposed on the charging current and the discharging current. However, since the charging current or the discharging current is large when the high output type secondary battery is targeted for testing, the ratio of ripples or noise to the magnitude of the current becomes very small. Thus, it is possible to evaluate the charge and discharge characteristics on the basis of the detected charging current or discharging current without causing a decrease in reliability.

On the other hand, when the secondary battery (BT) to be tested is a low output (several volts to several tens of volts) type, the bridge circuit (Q1 to Q4) is controlled in the second mode (series regulate mode). That is, in the second mode, the first and second switch elements are controlled to change the current flowing through the first switch element (Q1) or the second switch element (Q2) up and down and gradually, so that the generated ripples or noise is virtually made into zero because the bridge circuit is operated in the series regulated system instead of the switching operation as described above.

Thus, according to the charge and discharge testing device according to the present invention, it is possible to evaluate the charge and discharge characteristics with high reliability even with respect to both of the high output type and low output type secondary batteries.

Incidentally, in the above-described embodiment, the transistors are used as the first to fourth switch elements, but the third and fourth switch elements may be a relay as long as at least the first and second switch elements (Q1, Q2) are transistors.

DESCRIPTION OF REFERENCE NUMERALS 22 control unit
100 charge and discharge testing device
B1 DC power supply
BT battery
L1, L2 inductor
Q1-Q4 transistor
SR shunt resistor
SEL selector
SW1, SW2 short-circuit switch
TM0, TM1 output terminal

The invention claimed is:

1. A charge and discharge testing device which performs a charge and discharge test on a secondary battery, comprising:
    first and second output terminals which connect both ends of the secondary battery;
    a bridge circuit in which first and second switch elements connected to each other in tandem through a first connection point, and third and fourth switch elements connected to each other in tandem through a second connection point are connected in parallel between a power supply line and a ground line;
    a charge and discharge current path including a shunt resistor and a first inductor, and reaching from the first connection point to the second connection point via the first output terminal and the second output terminal;

a capacitor connected between the first and second output terminals; and a control unit which receives a mode signal to designate a first or second mode, and controls the first to fourth switch elements based on the mode signal, wherein when the mode signal indicates the first mode, the control unit controls the first to fourth switch elements so that the first and the fourth switch elements and the second and the third switch elements are alternately turned on and off, and wherein when the mode signal indicates the second mode, the control unit controls the third switch element to be an off state and the fourth switch element to be an on state, and apples control to continuously change an analog voltage greater than or equal to a gate threshold voltage up and down to the first switch element at a time of charge control and to the second switch element at a time of discharge control.

2. The charge and discharge testing device according to claim 1, wherein the first inductor is connected between the first connection point and the first output terminal in the charge and discharge current path, and wherein the charge and discharge current path includes a second inductor connected between the second connection point and the second output terminal.

3. The charge and discharge testing device according to claim 1, wherein the first and second switch elements are transistors, and wherein when the mode signal indicates the second mode, the control unit supplies an analog output control signal in which an analog voltage greater than or equal to a threshold voltage of the first switch element or the second switch element changes up and down, to control terminals of the first and second switch elements.

4. The charge and discharge testing device according to claim 2, including:

a first short-circuit switch connected to both ends of the first inductor, and a second short-circuit switch connected to both ends of the second inductor, wherein when the mode signal indicates the first mode, the control unit sets both the first and the second short-circuit switches to an off state, and wherein when the mode signal indicates the second mode, the control unit sets the first and the second short-circuit switches to an on state to short-circuit both ends of the first inductor and short-circuit both ends of the second inductor.

5. The charge and discharge testing device according to claim 1, wherein each of the first to the fourth switch elements is a transistor which has first and second signal ends and makes a current corresponding to a control signal supplied to its own control terminal to flow between the first and the second signal ends, and wherein the second signal end of the first switch element and the first signal end of the second switch element are connected to the first connection point, and the second signal end of the third switch element and the first signal end of the fourth switch element are connected to the second connection point.

6. The charge and discharge testing device according to claim 5, wherein the power supply line is connected to the first signal end of each of the first and the third switch elements, and the ground line is connected to the second signal end of the fourth switch element, and further including:

a DC power supply having a positive polarity terminal connected to the ground line, and a selector which connects the second signal end of the second switch element to the ground line when the mode signal indicates the first mode, and connects the second signal end of the second switch element to a negative polarity terminal of the DC power supply when the mode signal indicates the second mode.

7. The charge and discharge testing device according to claim 6, wherein the DC power supply generates a DC voltage having a voltage value obtained by adding a predetermined margin voltage to a voltage drop portion accompanying an on resistance value of the second switch element, a resistance value of the first inductor, a resistance value of the shunt resistor, and a resistance value of a wiring resistance.

8. The charge and discharge testing device according to claim 5, including a third short-circuit switch connected to the first and the second signal terminals of the fourth switch element, wherein when the mode signal indicates the second mode, the control unit sets the third short-circuit switch to an on state to short-circuit between the first and the second signal ends of the fourth switch element.

* * * * *